United States Patent
Lipson et al.

(10) Patent No.: US 9,620,489 B2
(45) Date of Patent: Apr. 11, 2017

(54) INTEGRATED MULTI-CHIP MODULE OPTICAL INTERCONNECT PLATFORM

(71) Applicant: Cornell University, Ithaca, NY (US)

(72) Inventors: Michal Lipson, Ithaca, NY (US); Yoon Ho Lee, Ithaca, NY (US)

(73) Assignee: CORNELL UNIVERSITY, Ithaca, NY (US)

(*) Notice: Subject to any disclaimer, the term of this patent is extended or adjusted under 35 U.S.C. 154(b) by 0 days.

(21) Appl. No.: 14/298,875

(22) Filed: Jun. 6, 2014

(65) Prior Publication Data

US 2014/0264400 A1 Sep. 18, 2014

Related U.S. Application Data

(63) Continuation-in-part of application No. PCT/US2012/068031, filed on Dec. 5, 2012.
(Continued)

(51) Int. Cl.
*G02B 6/12* (2006.01)
*H01L 25/16* (2006.01)
(Continued)

(52) U.S. Cl.
CPC ........ *H01L 25/167* (2013.01); *G02B 6/12004* (2013.01); *G02B 6/12007* (2013.01);
(Continued)

(58) Field of Classification Search
USPC .......................................................... 385/14
See application file for complete search history.

(56) References Cited

U.S. PATENT DOCUMENTS

| 5,009,476 | A | 4/1991 | Reid et al. |
| 2003/0007754 | A1 | 1/2003 | Terashima |

(Continued)

FOREIGN PATENT DOCUMENTS

| JP | 08297264 | 11/1996 |
| WO | 03098302 | 11/2003 |

OTHER PUBLICATIONS

Choi, S. W., Authorized Officer, Korean Intellectual Property Office, International Application No. PCT/US2012/068031, International Search Report and Written Opinion, Mar. 26, 2013, 11 pages.

*Primary Examiner* — Eric Wong
(74) *Attorney, Agent, or Firm* — Perkins Coie LLP

(57) ABSTRACT

Techniques, systems, and devices are disclosed to provide multilayer platforms for integrating semiconductor integrated circuit dies, optical waveguides and photonic devices to provide intra-die or inter-die optical connectivity. For example, an integrated semiconductor device having integrated circuits respectively formed on different semiconductor integrated circuit dies is provided to include a carrier substrate structured to form openings on a top side of the carrier substrate; semiconductor integrated circuit dies fixed to bottom surfaces of the openings of the carrier substrate, each semiconductor integrated circuit die including a semiconductor substrate and an integrated circuit formed on the semiconductor substrate to include one or more circuit components, and each semiconductor integrated circuit die being structured to have a top surface substantially coplanar with the top side of the carrier substrate; and planar layers formed on top of the top surfaces of the semiconductor integrated circuit dies and the top side of the carrier substrate to include optical waveguides and photonic devices to provide (1) intra-die optical connectivity for photonic devices associated with a semiconductor integrated circuit die, or (2) inter-die optical connectivity for photonic devices associated with different semiconductor integrated circuit dies.

42 Claims, 13 Drawing Sheets

Related U.S. Application Data

(60) Provisional application No. 61/567,464, filed on Dec. 6, 2011.

(51) Int. Cl.

| | |
|---|---|
| *H01L 27/144* | (2006.01) |
| *H01L 25/00* | (2006.01) |
| *H01L 31/0232* | (2014.01) |
| *H01L 33/58* | (2010.01) |
| *H01L 23/13* | (2006.01) |

(52) U.S. Cl.
CPC ............ *H01L 25/50* (2013.01); *H01L 27/144* (2013.01); *H01L 31/0232* (2013.01); *H01L 33/58* (2013.01); *H01L 23/13* (2013.01); *H01L 2924/0002* (2013.01)

(56) References Cited

U.S. PATENT DOCUMENTS

| | | |
|---|---|---|
| 2005/0031291 A1 | 2/2005 | Gao et al. |
| 2010/0215314 A1* | 8/2010 | Lau .......................... G02B 6/43 385/14 |
| 2013/0016744 A1* | 1/2013 | Li ............................ B82Y 20/00 372/20 |

\* cited by examiner

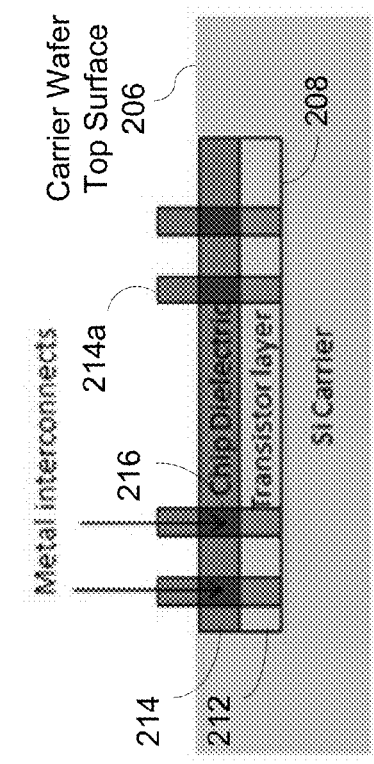
FIG. 2B
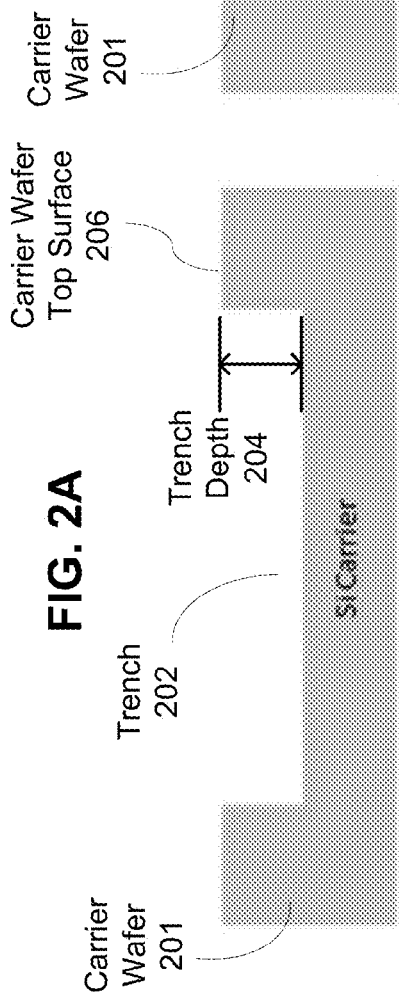
FIG. 2A
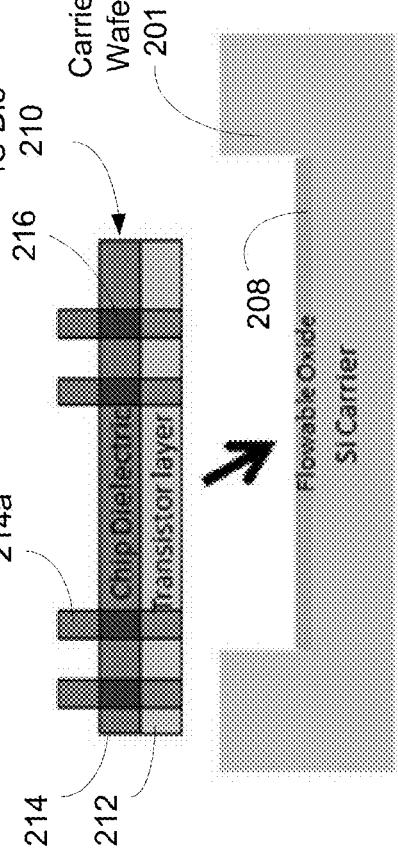
FIG. 2D
FIG. 2C

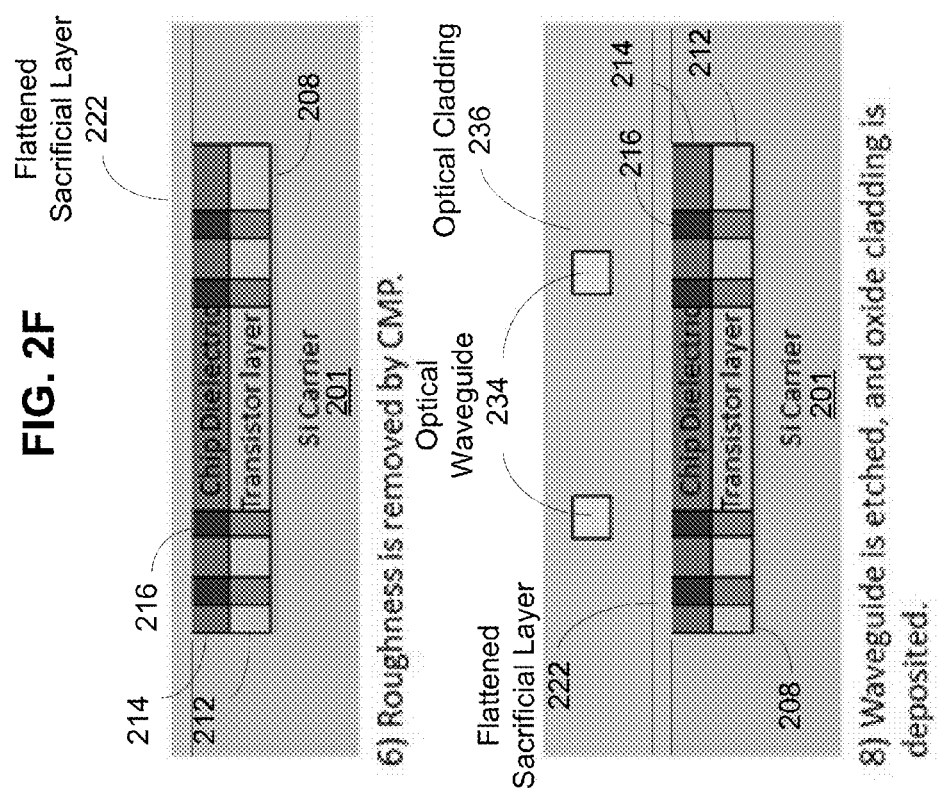
FIG. 2E / FIG. 2F / FIG. 2G / FIG. 2H

US 9,620,489 B2

INTEGRATED MULTI-CHIP MODULE OPTICAL INTERCONNECT PLATFORM

PRIORITY CLAIM AND RELATED PATENT APPLICATIONS

This patent document is a continuation-in-part application of PCT Application No.: PCT/US2012/068031 entitled "INTEGRATED MULTI-CHIP MODULE OPTICAL INTERCONNECT PLATFORM," filed Dec. 5, 2012, which was published under PCT Publication No. WO2013/086047A1 on Jun. 13, 2013, which is incorporated by reference as part of this document.

The PCT Application No.: PCT/US2012/068031 claims the priority of U.S. provisional application No. 61/567,464 entitled "INTEGRATED OPTICAL INTERCONNECT PLATFORM APPARATUS, METHOD, AND APPLICATIONS," filed on Dec. 6, 2011, which is incorporated by reference as part of this document.

STATEMENT REGARDING FEDERALLY SPONSORED RESEARCH OR DEVELOPMENT

This invention was made with government support from the Defense Advanced Research Projects Agency (DARPA) under Grant No. W911NF-11-1-0435 and from the National Science Foundation (NSF) under Grant No. EEC-0812072. The government has certain rights in this invention.

BACKGROUND

This patent document relates to photonic devices and techniques.

Photonic components, interconnects, devices and modules can be used to use modulated light for carrying and transferring information with a broad bandwidth and at a high speed in data communications. It is desirable in various applications to integrate electronic circuits such as microprocessors and other integrated processing circuits together with photonic interconnects and devices to provide high performance information processing and broadband communications between different circuits or processors, including using high speed photonic interconnects (e.g., optical waveguides) to interconnect different circuits or processors. As a specific example, advances in silicon and silicon-compatible photonics have spurred intense research in the area of optical interconnects for increasing the bandwidth and lowering the power of computing systems such as multi- and many-core processors.

Various technical challenges exist in integrating electronic circuits, photonic or optical components together, including limited real estate on semiconductor substrates for integrating electronic components/devices and photonic components/devices, certain incompatibility between processing in fabrication of electronics and processing for fabrication of photonics and interconnect issues between electronics and photonic devices.

SUMMARY

Techniques, systems, and devices are disclosed to provide multilayer platforms for integrating semiconductor integrated circuit dies, optical waveguides and photonic devices to provide intra-die or inter-die optical connectivity.

In one aspect, an integrated semiconductor device having integrated circuits respectively formed on different semiconductor integrated circuit dies is provided to include a carrier substrate structured to form openings on a top side of the carrier substrate; semiconductor integrated circuit dies fixed to bottom surfaces of the openings of the carrier substrate, each semiconductor integrated circuit die including a semiconductor substrate and an integrated circuit formed on the semiconductor substrate to include one or more circuit components, and each semiconductor integrated circuit die being structured to have a top surface substantially coplanar with the top side of the carrier substrate; and planar layers formed on top of the top surfaces of the semiconductor integrated circuit dies and the top side of the carrier substrate to include optical waveguides and photonic devices to provide (1) intra-die optical connectivity for photonic devices associated with a semiconductor integrated circuit die, or (2) inter-die optical connectivity for photonic devices associated with different semiconductor integrated circuit dies.

In another aspect, a method for providing optical interconnects to various devices on an integrated platform is provided to include providing different integrated circuits on separated semiconductor integrated circuit dies; embedding the semiconductor integrated circuit dies in openings of a carrier substrate to fix each semiconductor die on a bottom surface of the carrier substrate in each opening to make a top surface of each semiconductor integrated circuit die substantially coplanar with a top side of the carrier substrate; and forming planar layers on top of the top surfaces of the semiconductor integrated circuit dies and the top side of the carrier substrate to include optical waveguides and photonic devices to provide inter-die optical connectivity for photonic devices associated with different semiconductor integrated circuit dies to enable direct optical communication from one die to another die without converting an optical signal into an electrical signal when communicating between two dies.

In another aspect, a method for fabricating an integrated platform that supports different devices and optical interconnects for the different devices is provided to include processing a carrier substrate to form openings on a top side of the carrier substrate; forming an adhesive layer in a bottom surface in each opening of the carrier substrate; and placing semiconductor integrated circuit dies over bottom surfaces of the openings of the carrier substrate so that each semiconductor integrated circuit die is fixed in position by the adhesive layer. Each semiconductor integrated circuit die includes a semiconductor substrate and an integrated circuit formed on the semiconductor substrate to include one or more circuit components, and each semiconductor integrated circuit die is structured to have a top surface substantially coplanar with the top side of the carrier substrate. This method further includes forming a sacrificial layer over the top surfaces of the semiconductor integrated circuit dies and the top side of the carrier substrate; processing the sacrificial layer to produce a flat top surface; forming planar layers over the flat top surface of the sacrificial layer to include optical waveguides and photonic devices in the planar layers to provide inter-die optical connectivity for photonic devices associated with different semiconductor integrated circuit dies; and forming electrical contacts to the semiconductor integrated circuit dies.

In another aspect, an integrated semiconductor device having integrated circuits respectively formed on different semiconductor integrated circuit dies is provided to include a carrier substrate structured to form openings on a top side of the carrier substrate; and semiconductor integrated circuit dies fixed to bottom surfaces of the openings of the carrier substrate. Each semiconductor integrated circuit die includes a semiconductor substrate, at least one integrated circuit formed on the semiconductor substrate, and one or more conductive contacts to provide electrical conductivity between the at least one integrated circuit and a circuit outside the semiconductor integrated circuit die. The device further includes a dielectric layer formed over the semiconductor integrated circuit dies and the top side of the carrier substrate and processed to provide a planar top surface; and planar optical layers formed on top of the planar top surface of the dielectric layer, the planar optical layers structured to include one or more optical waveguides and one or more photonic devices. One photonic device in the planar optical layers is electrically coupled to one of the semiconductor integrated circuit dies underneath the planar optical layers to either receive an electrical signal from, or send an electrical signal to, the coupled semiconductor integrated circuit die, and one optical waveguide in the planar optical layers is coupled to optically interconnect the one photonic device electrically coupled to the semiconductor integrated circuit die with another photonic device in the planar optical layers.

In another aspect, an integrated structure includes a carrier substrate; a plurality of semiconductor integrated circuit dies embedded within the carrier substrate, where each semiconductor integrated circuit die has a surface substantially coplanar with the carrier substrate; and at least one optical component layer located upon exposed portions of the carrier substrate and the plurality of semiconductor integrated circuit die. In implementations, the structure may include a silicon semiconductor substrate as the carrier substrate; the optical component layer may include a planarized optical interconnect layer.

In another aspect, a method is provided for fabricating an integrated structure and includes assembling within a plurality of trenches within a carrier substrate a plurality of semiconductor integrated circuit die so that a surface of each semiconductor integrated circuit die is substantially coplanar with a surface of the carrier substrate; and forming upon the exposed surfaces of the plurality of semiconductor integrated circuit die and the carrier at least one optical component layer. In implementations, this method may, in the assembling the plurality of integrated circuit die to the carrier substrate, use a flowable adhesive material.

In yet another aspect, an integrated semiconductor device is provided to include integrated circuits respectively formed on different semiconductor integrated circuit dies. This device includes a carrier substrate structured to form openings on a top side of the carrier substrate; semiconductor integrated circuit dies fixed to bottom surfaces of the openings of the carrier substrate, each semiconductor integrated circuit die including a semiconductor substrate, at least one integrated circuit formed on the semiconductor substrate, and one or more conductive contacts to provide electrical conductivity between the at least one integrated circuit and a circuit outside the semiconductor integrated circuit die; a dielectric layer formed over the semiconductor integrated circuit dies and the top side of the carrier substrate and processed to provide a planar top surface; and planar optical layers formed on top of the planar top surface of the dielectric layer, the planar optical layers structured to include one or more optical waveguides and one or more photonic devices. One of the one or more photonic devices in the planar optical layers is electrically coupled to one of the semiconductor integrated circuit dies underneath the planar optical layers to either receive an electrical signal from, or send an electrical signal to, the coupled semiconductor integrated circuit die. One of the one or more photonic devices in the planar optical layers includes a nonlinear optical device that is optically coupled one optical waveguide to receive a pump light and to produce one or more optical signals at optical wavelengths different from the pump light.

These and other aspects and their implementations are described in greater detail in the attached drawing, the description and the claims.

BRIEF DESCRIPTION OF THE DRAWINGS

FIGS. 2A through 2H show an example of a process for fabricating a multilayer platform based on the design in FIG. 1A.

DETAILED DESCRIPTION

Figure 1A:
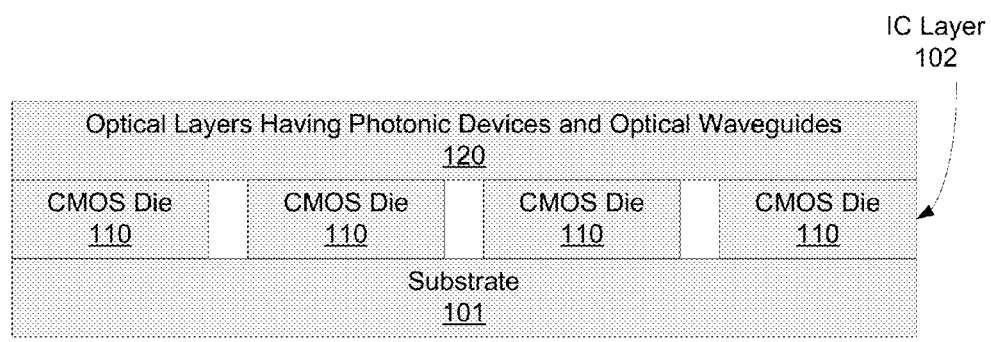
FIGS. 1A and 1B show examples of multilayer platforms that integrate semiconductor integrated circuit dies, optical waveguides and photonic devices over a common substrate to provide intra-die or inter-die optical connectivity.

Specific examples of multilayer platforms are described below to integrate semiconductor integrated circuit dies, optical waveguides and photonic devices over a common substrate to provide intra-die or inter-die optical connectivity. FIG. 1A shows an example of a multilayer platform that includes a substrate 101, an integrated circuit (IC) layer 102 having IC dies 110 formed over the substrate 101 and optical layers 120 formed over the IC layer 102. Each semiconductor integrated circuit die 110 is pre-fabricated with a desired processing, such as a fabrication process for IV semiconductors like the complementary metal-oxide-semiconductor (CMOS) processing for Si circuits or a fabrication processing for III-V semiconductors for various optoelectronic circuits. Each semiconductor integrated circuit die 110 in the IC layer 102 includes a semiconductor substrate and one or more integrated circuits formed on the semiconductor substrate or includes one or more circuit components. On top of the semiconductor integrated circuit dies 110, planar layers 120 are formed to include optical waveguides and photonic devices. This multilayer platform places semiconductor integrated circuit dies 110 in an IC layer 102 that is separate from the planar layers 120 hosting the optical waveguides and photonic devices to enable freedom and flexibility in placing the optical waveguides for inter-die optical interconnects without being affected by the placement of the semiconductor integrated circuit dies 110 of the IC layer 102. If needed, additional layers can be formed to add optical waveguides or photonic devices to further increase the freedom and flexibility in placing the optical waveguides and photonic devices relative to the underlying semiconductor integrated circuit die 110. Similarly, more than one IC layers 102 may be implemented. An underlying semiconductor integrated circuit die 110 includes conductive contacts that are coupled to a photonic device with the planar layers 120 above the IC layer 102 to provide an electrical signal or control to the coupled photonic device which may be, e.g., a photodetector, an optical resonator or an optical modulator. Notably, the optical waveguides can be used to provide (1) intra-die optical connectivity for photonic devices associated with a semiconductor integrated circuit die 110, or (2) inter-die optical connectivity for photonic devices associated with different semiconductor integrated circuit dies 110.

The above multilayered configuration in FIG. 1A significantly reduces the obstacles in placing optical interconnects due by avoiding problematic optical waveguide crossings in the same layer and providing flexibility in arranging electric conductive paths or optical waveguides in a particular layer. Such a multilayered configuration can also reduce limitations due to real estate on a chip. Notably, the multiplayer configuration in FIG. 1A enables multilayered photonics that opens up a new dimension to explore; facilitates denser as well as more complex networks with radically higher cross-sectional bandwidth and reduced communication power consumption. The above multilayer configuration can also be implemented to separate the process for fabricating the optical layers 120 from the process for fabricating the IC layer 102. As such, the integration of photonic interconnects with on-chip electronics avoids a costly change to a well-established process used in fabricating either the IC layer 102 (e.g., the CMOS process) or the optical layers 120.

In some implementations, the substrate 101 can be a carrier substrate structured to form openings on a top side of the carrier substrate 101. The semiconductor integrated circuit dies 110 are fixed to bottom surfaces of the openings of the carrier substrate 101. Each semiconductor integrated circuit die 110 includes its own semiconductor substrate, at least one integrated circuit formed on the semiconductor substrate, and one or more conductive contacts to provide electrical conductivity between the at least one integrated circuit and a circuit outside the semiconductor integrated circuit die 110. A dielectric layer can be formed over the semiconductor integrated circuit dies 110 and the top side of the carrier substrate 101 and processed to provide a planar top surface. The planar optical layers 120 are then formed on top of the planar top surface of the dielectric layer and are structured to include one or more optical waveguides and one or more photonic devices. One photonic device in the planar optical layers 120 is electrically coupled to one of the semiconductor integrated circuit dies 110 underneath the planar optical layers 120 to either receive an electrical signal from, or send an electrical signal to, the coupled semiconductor integrated circuit die 110, and one optical waveguide in the planar optical layers 120 is coupled to optically interconnect the one photonic device electrically coupled to the semiconductor integrated circuit die 110 with another photonic device in the planar optical layers 120.

Figure 1B:
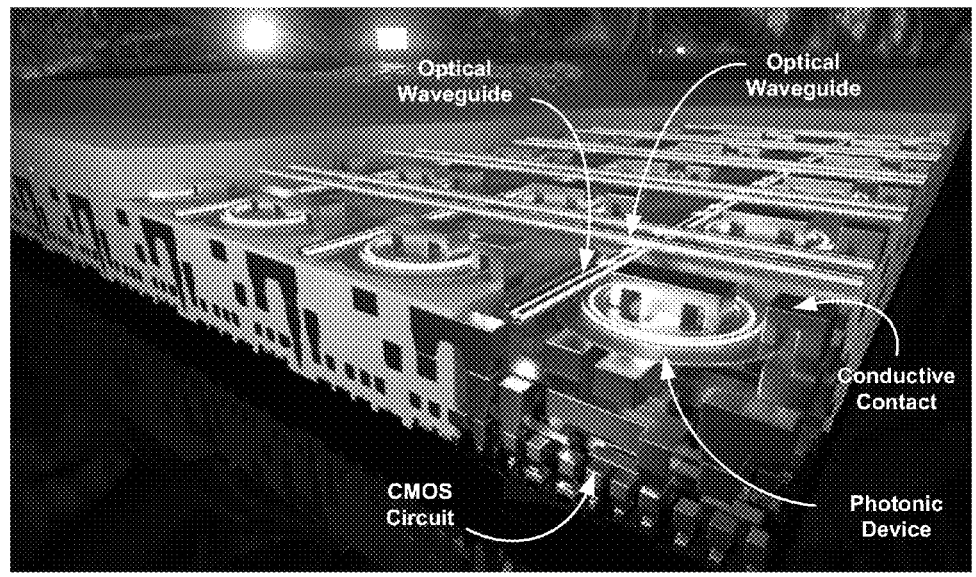

FIG. 1B shows an example of a 3D photonic network platform based on the multilayer configuration in FIG. 1A. This platform is a multi-chip module (MCM) which includes a CMOS circuit layer on the bottom and several photonic layers above the CMOS circuit layer to provide crossed optical waveguides in different optical layers without physical crossing in the same layer. As illustrated, the platform includes an array of photonic devices in the middle while the CMOS circuit layer underneath provides CMOS circuits that are respectively coupled to the photonic devices. The optical waveguides are formed either in the same layer as the photonic devices or above the photonic devices to provide desired optical interconnects.

In FIG. 1B, the CMOS circuits can be implemented to provide desired circuit functions. For example, the CMOS circuits may include a central processing unit (CPU) on one of the semiconductor integrated circuit dies to enable communication to and from the CPU via one or more of the optical waveguides above the CMOS circuit layer. The CMOS circuits may include a memory device in communication with the CPU via one or more optical waveguides to provide high-bandwidth communications between the CPU and the memory device. As yet another example, the CMOS circuits may include a graphic processing unit (GPU) in communication with the CPU via one or more of the optical waveguides.

The multilayer configurations in the examples in FIGS. 1A and 1B enable planar processing of integrated optics between semiconductor dies. Planar processing takes direct advantage of various processing advancements in the semiconductor industry. As further described below, the multiplayer configuration can be implemented by embedding the dies in mechanically stable trenches of a common carrier substrate that match the dimension of the dies. The dies can be glued down the trenches to withstand mechanical vibrations and/or shocks. Under this implementation, the chips or dies are placed in a mechanically stable carrier substrate, it is more conducive to attaching heat sinks to manage heat, which can be critical for reliable operation of modern integrated circuits.

Due to the separation of layers for the IC circuits and the optical waveguides, a multilayer configuration based on the disclosed technology in this document allows flexible and versatile routing of optical interconnects between and through several nodes of the optical multi-chip module without being limited to optical routing just between one node to another. This flexible optical routing provides varying interconnects for various functionality that may be difficult to achieve in other integration architectures. Specifically, a module with more than two dies based on the present multilayer configuration can provide optical routing between and through all other dies for maximum flexibility and connectivity.

In the above multilayered configuration as illustrated in FIG. 1A or 1B, optical devices can be placed at various desired locations with respect to the underlying integrated circuits located on the dies, without requiring to place optical devices to be at certain locations, e.g., the edge of the semiconductor dies. This flexible placement capability is beneficial for multiple reasons. For example, this flexible placement capability frees up of the edge of the dies for wirebonds and/or solder bumps for electrical interconnection, which tends to be overcrowding. For another example, this flexible placement capability provides sufficient real estate for optical devices due to being in multiple optical layers and has flexibility for optical routing that is difficult to achieve by using the real estate in the IC layer for the underlying individual dies. In addition, this flexible placement capability allows for routing of global signal directly from the origin to the destination in the more efficient optical interconnect, instead of having to use inefficient long electrical interconnect, then conversion or switch to optical interconnect.

As a specific example for implementing the above multilayer configuration in FIG. 1A, FIGS. 2A-2H show a process for fabricating an integrated multi-chip module by using a Si carrier substrate and the structure of the multi-chip module. The illustrated method for fabricating the integrated multi-chip module that supports different devices and optical interconnects for the different devices includes processing a carrier substrate to form openings on a top side of the carrier substrate; forming an adhesive layer in a bottom surface in each opening of the carrier substrate; and placing semiconductor integrated circuit dies over bottom surfaces of the openings of the carrier substrate so that each semiconductor integrated circuit die is fixed in position by the adhesive layer. Each semiconductor integrated circuit die includes a semiconductor substrate and an integrated circuit formed on the semiconductor substrate to include one or more circuit components, and each semiconductor integrated circuit die is structured to have a top surface substantially coplanar with the top side of the carrier substrate. The illustrated method also includes forming a sacrificial layer over the top surfaces of the semiconductor integrated circuit dies and the top side of the carrier substrate; processing the sacrificial layer to produce a flat top surface; forming planar layers over the flat top surface of the sacrificial layer to include optical waveguides and photonic devices in the planar layers to provide inter-die optical connectivity for photonic devices associated with different semiconductor integrated circuit dies; and forming electrical contacts to the semiconductor integrated circuit dies.

As shown in FIGS. 2A and 2B, the fabrication process starts by preparing a carrier substrate 201 for hosting individual IC dies 210 by first forming openings or trenches 202 on a top side of the carrier substrate 201. For example, contact photolithography can be used to define the openings or trenches 202 with precise dimensions for die placement within a few microns of tolerance. This moderate tolerance gives enough mechanical clearance for a die 210 to sit and orient with respect to other dies 210. The depth 204 of the openings or trenches 202 can be controlled, e.g., by using Bosch etch (or wet etch) to achieve a desired to substantially match the thickness of dies 210 so that the carrier wafer top surface 206 is substantially coplanar with the top surface of the die 210. An adhesive layer 208 is subsequently formed on the bottom surface in each trench 202. This can be done by applying a small drop of flowable oxide in the trench 202. Next, the dies 210 are placed in the trenches 202 and a light pressure is applied on the dies in the trenches 202 to allow adhesion of each die 210 to the carrier substrate 201. The carrier substrate 201 is then baked at a suitable baking temperature (e.g., at 400C for 1 hour) to bake out solvents and form oxide bonding of the dies 210 to the carrier substrate 201. In this example, the subsequent deposition steps can be performed at 400C. See FIGS. 2C and 2D.

In the illustrated example, each die 210 includes a substrate on which an IC layer 212 is formed (e.g., a transistor layer) and a chip dielectric layer 214 is formed over the IC layer 212. Electrically conductive contacts 216 are formed in the die 210 to allow electrical contacts between the IC circuit on the die 210 and circuitry outside the die 210. The conductive contacts 216 are used to provide electrical power to and or signaling/communication associated with the IC circuit on the die 210 as part of the IC layer 102 in FIG. 1A, including providing electrical connectivity with a photonic device in the optical layers 120 in FIG. 1A. Conductive contacts 216 can be conductive lines, pads or vias depending on the specifics of the die 210. Due to presence of the conductive contracts 216, the chip dielectric layer 214 tends to have bumps or protrusions 214a over locations of the conductive contracts 216.

Next, as shown in FIGS. 2E and 2F, a layer of a sacrificial material 220 is formed over the top surfaces of the semiconductor integrated circuit dies 210 and the top side 206 of the carrier substrate 201. For example, several microns of PECVD Silicon Oxynitride can be used as the sacrificial layer 220 on the wafer, taking care not to induce excessive stress on the wafer. The top part of the sacrificial layer 220 can be processed, e.g., removed and polished, to produce a flat top surface for forming the optical layers. For example, a chemical mechanical polishing (CMP) process can be performed to polish the deposited surface of the layer 220 down to a desired thickness and roughness (e.g., below 3 nm RMS roughness). In FIG. 2G, a lower cladding layer 230 is deposited over the polished layer 220, e.g., a layer of 3 um of PECVD Silicon Oxide as an optical under cladding. In addition, an optical waveguide layer 232 is formed over the lower cladding layer 230. For example, a layer of 400 nm of low stress PECVD Silicon Nitride can be used as the optical waveguide layer 232. The refractive index of the optical waveguide layer 232 is higher than that of the cladding layer 230. Next in FIG. 2H, an aligned photolithography process is performed on an i-line stepper, followed by ICP-RIE etching of Silicon Nitride to etch out optical waveguides 234. An interlayer dielectric layer (e.g., a dielectric oxide) is deposited over the exposed surfaces of the under cladding layer 230 and the waveguides 234 to bury the optical waveguides 234 so that the combined structure of the under cladding layer 230 and the later deposited interlayer dielectric layer together form the final optical cladding 236 in which the optical waveguides 234 are embedded. Subsequently, additional optical layers can be formed as needed to add photonic devices and/or optical waveguides. After the final optical layer, the whole structure over the wafer is cladded with 2 um of PECVD Silicon oxide, completing the process.

In the above multilayer design, multiple optical layers over the IC layer can be used to provide various optical or photonic devices/components, including either or both optically passive and optically active devices or components. Examples of optically passive devices or components include a passive optical delay line, a passive optical resonator, a passive optical bandpass filter, a passive optical grating, a passive optical add/drop filter, or other optical/photonic components that are fixed in their properties and cannot be tuned or controlled. Examples of optically active devices or components include optical/photonic devices that can be controlled by a control signal to change or modify a property of a signal such as an optical modulator including an electro-optical modulator, an optical-to-electrical conversion device such as a photodetector, an electrical-to-optical conversion device such as an optical amplifier, a light source/laser. The use of the carrier substrate 201 provides a common and stable platform for supporting the IC layer and optical layers. This construction is mechanically robust and based on planar processing for convenient fabrication.

Figure 3:
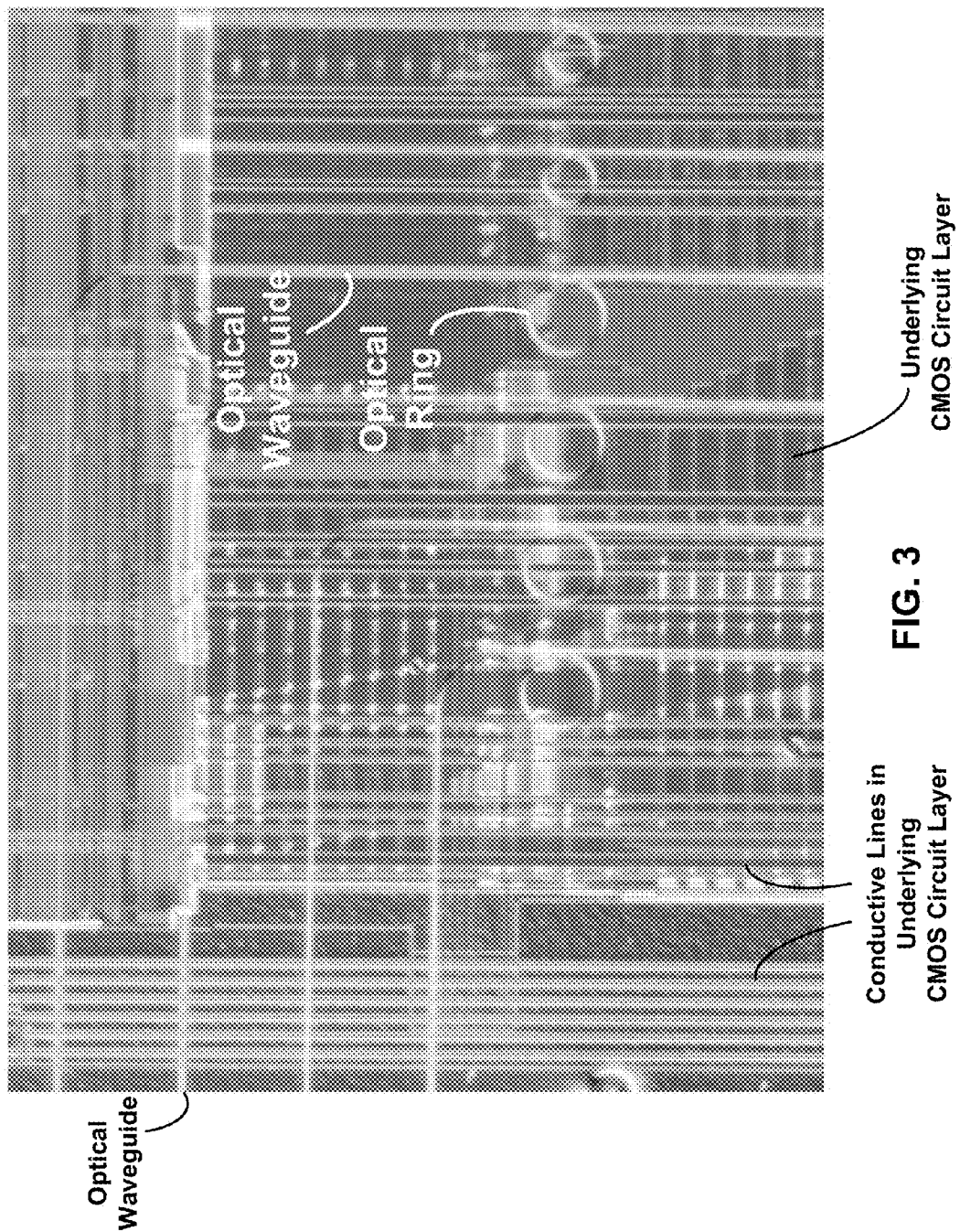
FIG. 3 shows one example of a device fabricated by the process in FIGS. 2A through 2H.

FIG. 3 shows an example of a multilayer structure formed by the above process in FIGS. 2A-2H where an optical ring is formed in or coupled to some optical waveguides on top of the underlying CMOS circuit layer. Such an optical ring can be a passive ring or an active ring in form of an electro-optic modulator or switch.

Figure 4:
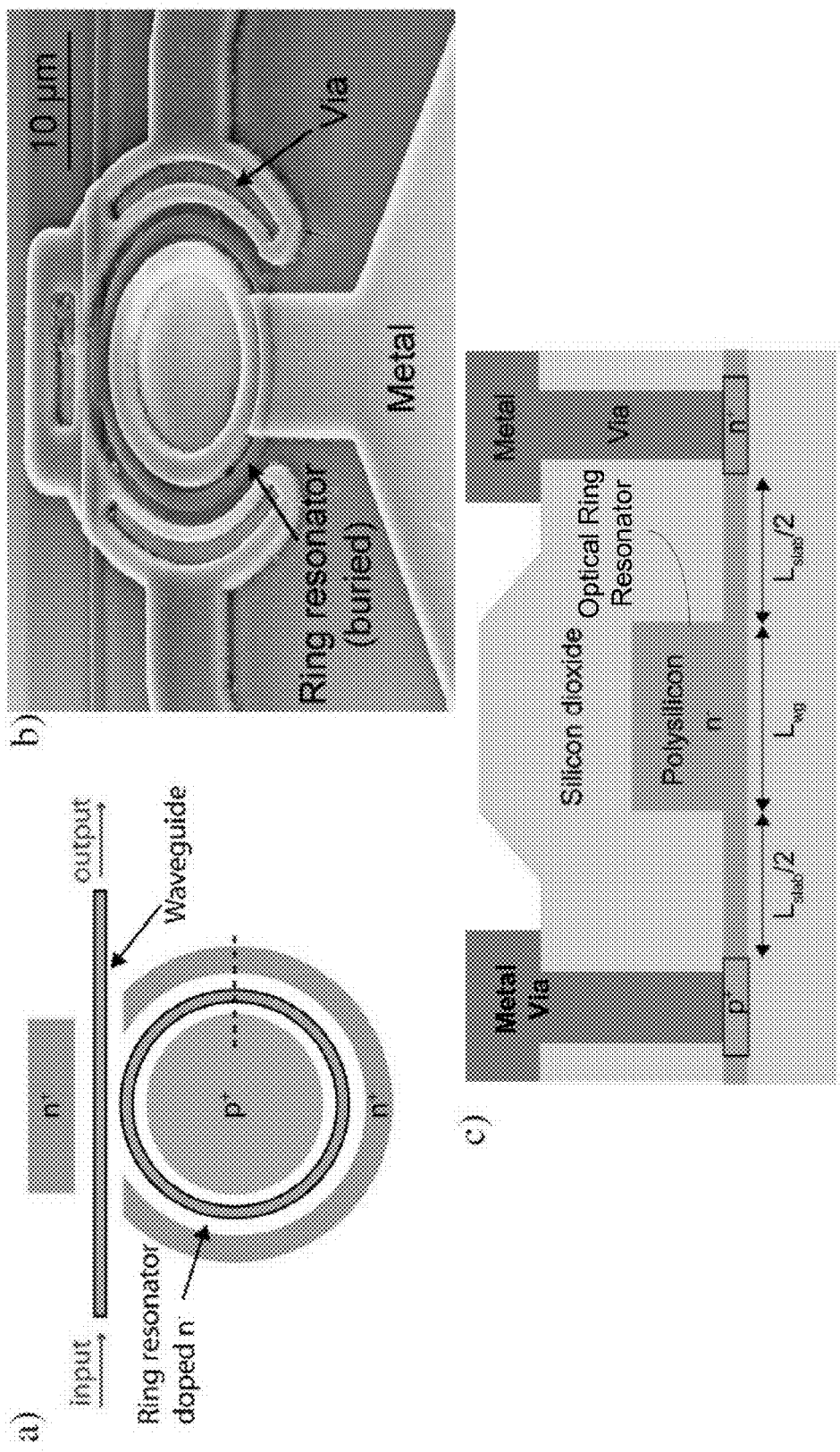
FIG. 4 shows an opto-electrical modulator based on an optical ring resonator in a diode structure.

FIG. 4 illustrates an example of an active optical ring based on an electro-optic diode design. This active ring can be configured as a micrometer-scale electro-optic modulator by using a polysilicon ring resonator of a radius of 20 μm or 10 μm embedded in a 40 nm-tall $p^+n^-n^+$ diode structure and laterally coupled to a polysilicon waveguide. In a prototype sample device, the modulator can be operated at 2.5 Gbps and 10 dB extinction ratio. In addition, this device can be fabricated using the Excimer Laser Annealing (ELA) process to be operated at 3 Gbps. The polycrystalline silicon material exhibits properties that simultaneously enable high quality factor optical resonators and sub-nanosecond electrical carrier injection. An embedded $p^+n^-n^+$ diode can be used to achieve optical modulation using the free carrier plasma dispersion effect. Active optical devices in a deposited microelectronic material can break the dependence on the traditional single layer silicon-on-insulator platform and help lead to monolithic large-scale integration of photonic networks on a microprocessor chip.

FIG. 4 includes FIG. 4a, FIG. 4b and FIG. 4c. More specifically, FIG. 4a depicts a top plan schematic view of an electro-optic modulator formed over a substrate formed of a deposited microelectronic material, such as polycrystalline silicon (i.e. polysilicon), for example. In other implementations, the substrate may be formed from at least one of another form of silicon, germanium, or a compound semiconductor such as gallium arsenide or indium phosphide, for example. Electro-optic modulator includes an optical ring resonator doped with $n^-$, a p-type doped semiconducting region ($p^+$) inside the ring resonator, and another n-type doped semiconducting region ($n^+$) outside the ring resonator so that the $n^-$-doped ring resonator is sandwiched between the inner semiconducting region ($p^+$) and the outer semiconducting region ($n^+$) to form the embedded $p^+n^-n^+$ diode structure. An optical waveguide is formed on the substrate close to the ring resonator to be optically coupled with the ring resonator by optical evanescent coupling to provide input light to the ring resonator and output light out of the ring resonator. An additional n-type doped semiconducting region ($n^+$) is formed on the other side of the optical waveguide to so that the segment of the ring resonator closest to the optical waveguide is also in the $p^+n^-n^+$ diode structure. An electrical signal is applied to the $p^+n^-n^+$ diode structure to control the carrier injection and optical modulation using the free carrier dispersion effect. This electrical signal can be used to change or control the resonant wavelength of the optical ring resonator, thus changing or controlling the optical transmission of an optical signal output by the optical waveguide.

FIG. 4b shows a scanning electron microscope (SEM) image of the device in FIG. 4a where a ring polysilicon resonator and 450 nm-wide bus waveguide are buried under 1 μm silicon dioxide. FIG. 4c further show a cross-section schematic of the device (not to scale) in FIG. 4a.

Figure 5A:
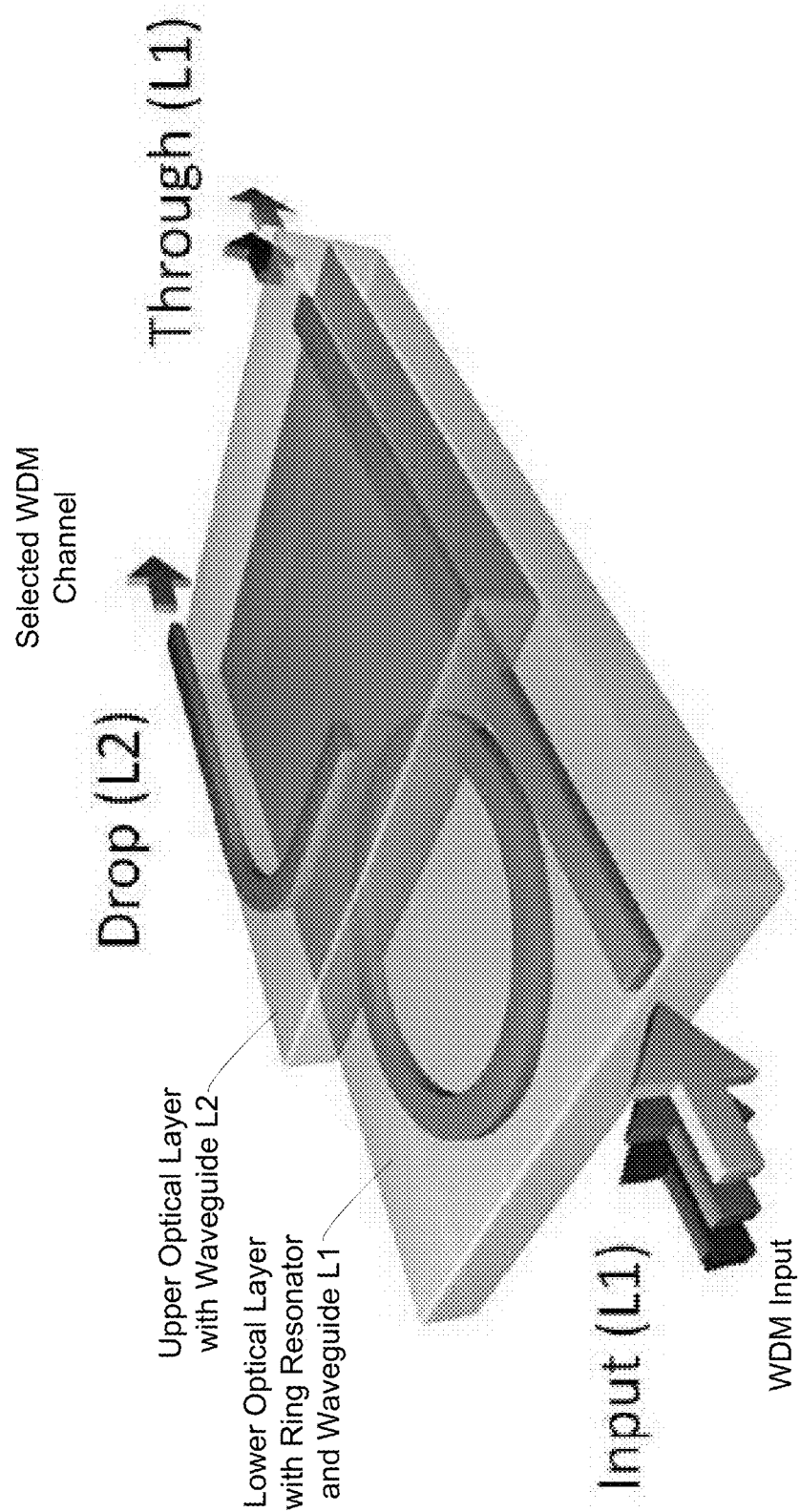
FIGS. 5A and 5B show an example of an optical wavelength division multiplexing (WDM) device using an optical ring in interaction with two optical waveguides at different optical layers in a multilayer configuration based on FIG. 1A.
Figure 5B:
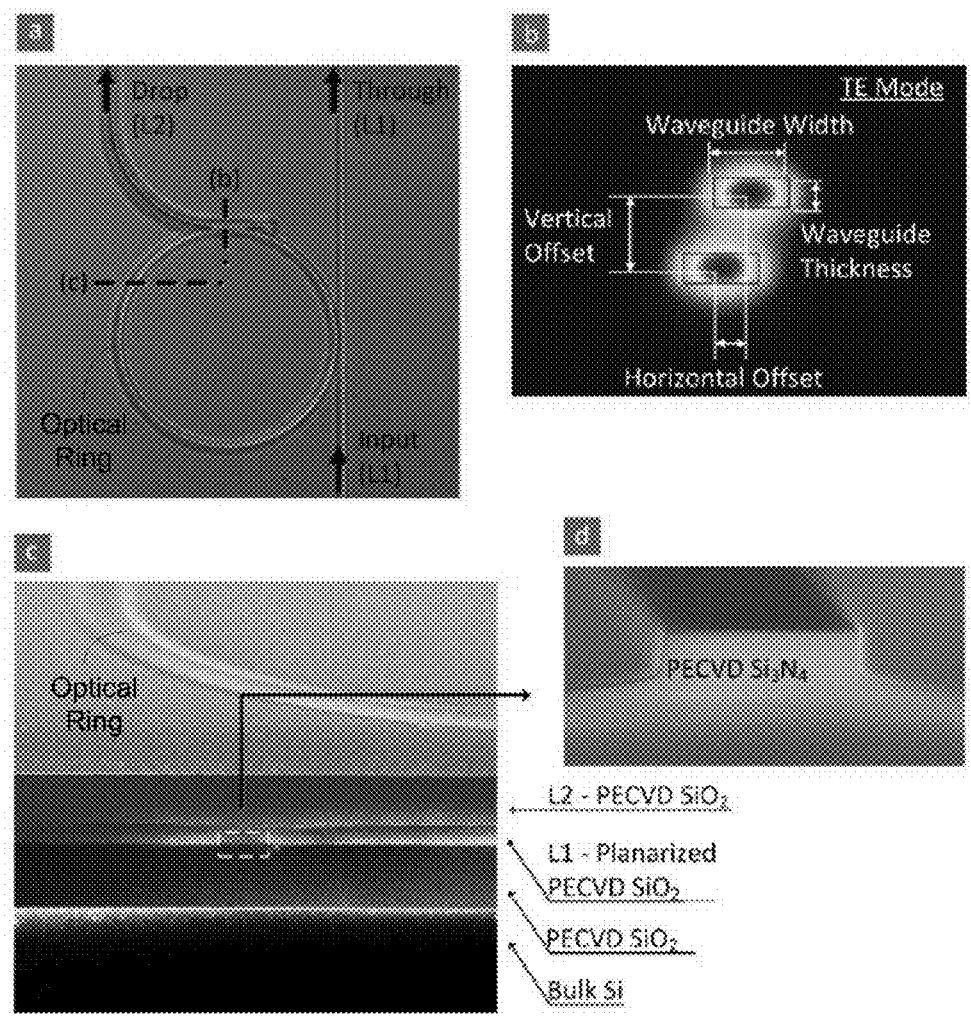

FIGS. 5A and 5B show an example of an optical wavelength division multiplexing (WDM) device using an optical ring in interaction with two optical waveguides at different optical layers in a multilayer configuration based on FIG. 1A. The optical coupling between two optical components in two different layers is based on evanescent optical coupling. This device effectuates a multi-layer optical link, traversing two layers and one passive WDM filter. The first layer (L1) on the lower side of the device is patterned with waveguides and rings with 30 μm radius. L1 spans the full die ending in inverse-tapered couplers on both ends of the chip to provide an input and through port. L2, the second upper photonic layer begins above the microring resonator in the first layer L1 and extends to the output facet, where light can be coupled out to read the drop port (see FIG. 5B-a). Referring to FIG. 5B-b, the optical coupling between the L2 waveguides and the ring resonator is set by the vertical and horizontal offsets provided by the mid-layer $SiO_2$ layer and lithographic positioning. FIGS. 5B-c and d show false-color SEM images of the cross section of the chip with emphasis on the L1 waveguide. The optical WDM device in FIGS. 5A and 5B can be a passive WDM drop device where the device configuration is fixed to effectuate separating a selected WDM wavelength from the input into the optical ring resonator and routing the selected WDM wavelength into the drop waveguide L2 while other WDM channels remain the waveguide L1. Alternatively, the optical WDM device in FIGS. 5A and 5B can be an active WDM drop device where the WDM wavelength that is coupled into the optical ring resonator can be controlled and adjusted by a control signal, e.g., a control signal applied to the optical ring resonator to alter the resonance condition of the optical ring resonator.

The above described multilayer configuration for integrating an IC layer with optical layers can be used to construct various photonic devices or modules. Some examples are provided below with respect to FIGS. 6, 7, 8 and 9.

Figure 6:
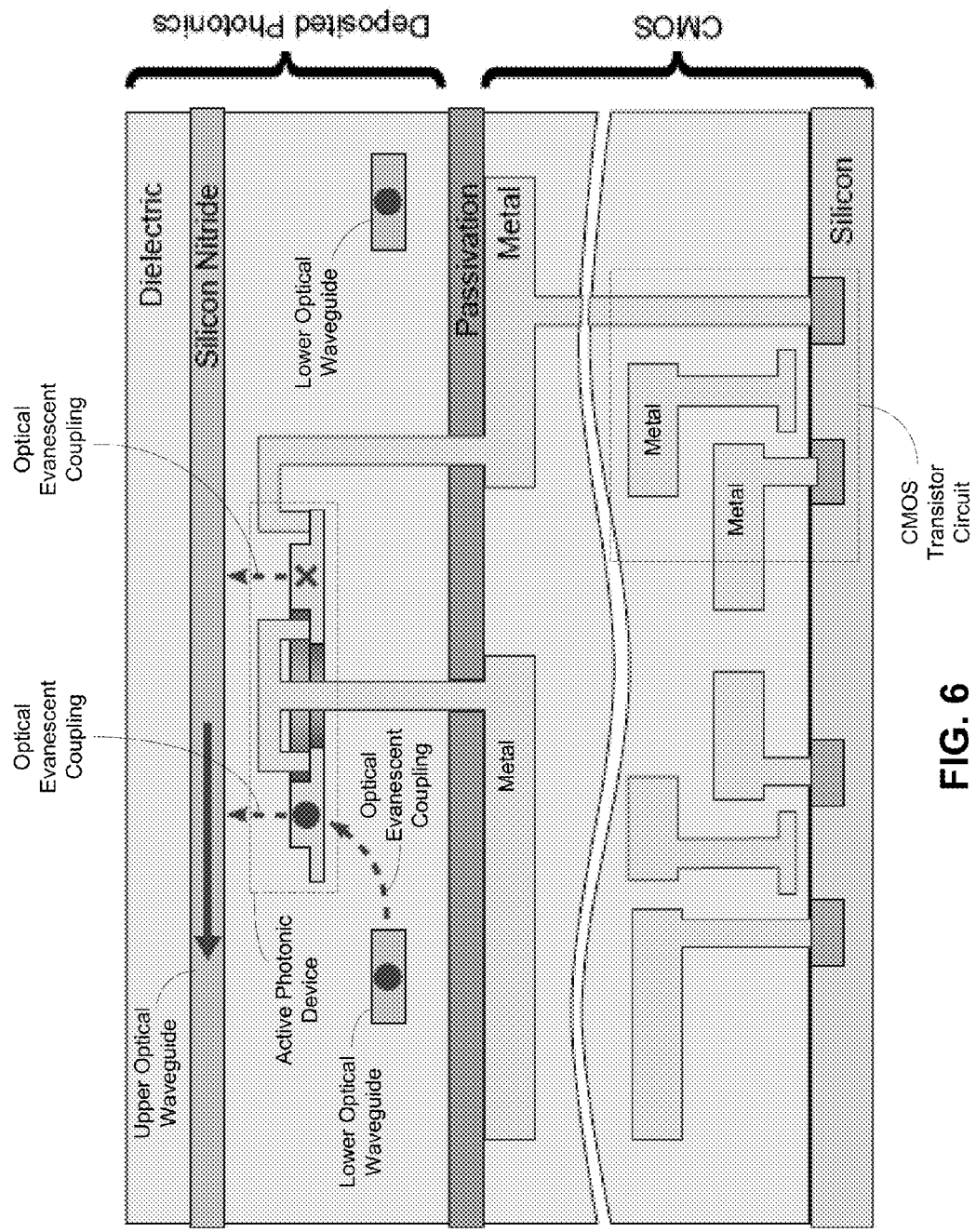
FIG. 6 shows an example of a CMOS backend deposited photonic device having a CMOS microelectronic layer and multiple layers having deposited photonic circuits on top of the CMOS backend.

FIG. 6 shows an example of a CMOS backend deposited photonic device having a CMOS microelectronic layer and multiple layers having deposited photonic circuits on top of the CMOS backend. The CMOS microelectronic layer includes the Front End Of Line (FEOL) having the transistors and other active devices fabricated on the silicon substrate at the bottom, and the Back End Of Line (BEOL) having multiple layers of metal (as many as 10 or more in modern logic process) and interlayer dielectric for connecting the frontend devices together to form a circuit. The BEOL in other CMOS devices ends with the last metal layer that interfaces with the outside and the passivation layer on top to protect the BEOL. In FIG. 6, the BEOL is connected to multiple photonic layers.

In the upper deposited photonics layer in the example in FIG. 6, two layers of Silicon Nitride (SiN (waveguides are marked as lower optical waveguide and upper optical waveguide. One layer of a Excimer Laser Anneal (ELA) polysilicon is shown to form the active photonic device that is electrically coupled to a CMOS transistor circuit in the CMOS layer. In the illustrated examples in FIGS. 6-9, the active photonic device is shown to be an optical ring resonator configured to provide a desired function (e.g., a modulator or detector). In implementations, such an active photonic device can be implemented in various configurations in connection with the underlying CMOS transistor circuit. Each optical waveguide needs optical isolation, and this isolation is provided in FIG. 6 by a layer of $SiO_2$ deposited using Plasma Enhanced Chemical Vapor Deposition (PECVD). Each SiN lower optical waveguide and the upper optical waveguide in multiple layers are oriented to be mutually orthogonal in order to minimize unwanted interlayer crosstalk and crossing losses. The optical ring resonator is evanescently coupled to a nearby lower optical waveguide and to the upper optical waveguide, thus effectuating as an optical via which may be configured to have a low crossing loss (e.g., −0.04 dB/cross) and a low interlayer coupling insertion (e.g., −0.6 dB). To modulate and detect optical data, separate active layers are placed in between any of the multiple SiN waveguide layers to efficiently couple to and from the bus waveguides.

Figure 7:
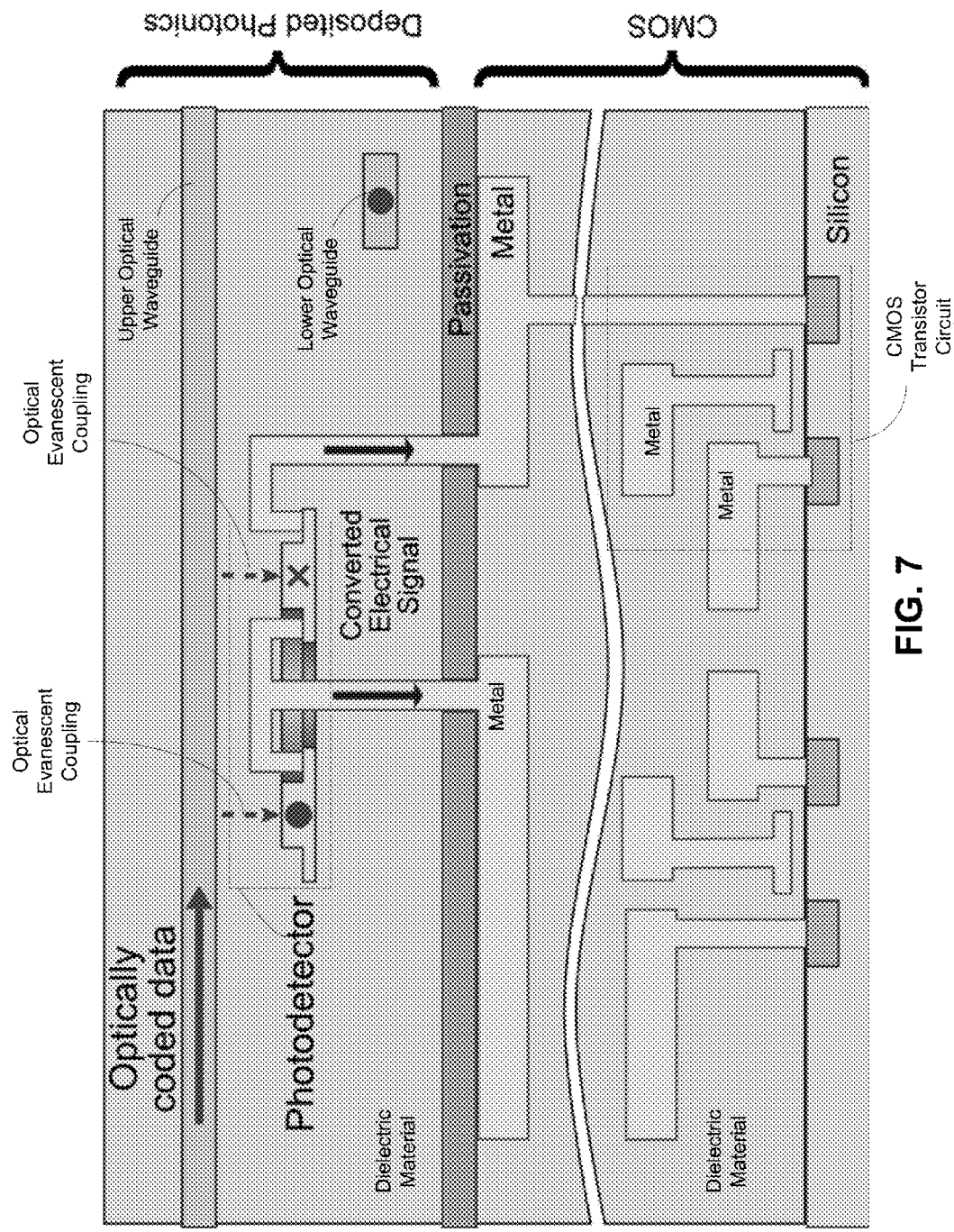
FIG. 7 shows an example of an optical detector formed in a CMOS backend deposited photonic device based on the architecture in FIG. 6.

FIG. 7 shows an example of an optical detector formed in a CMOS backend deposited photonic device based on the architecture in FIG. 6. An optical ring is formed below the upper optical waveguide to receive, via evanescent coupling, optically coded data in the light guided by the upper optical waveguide. The optical ring is configured as an optical detector which is electrically coupled to a CMOS transistor circuit for receiving the electrical output of the optical detector. As such, the optically coded data in the guided light in the upper optical waveguide is detected by the optical ring detector and the detected electrical signal is routed via the metal via interconnecting the optical ring detector and the underlying CMOS transistor circuit for output at the Front End Of Line (FEOL) fabricated on the silicon substrate at the bottom.

Figure 8:
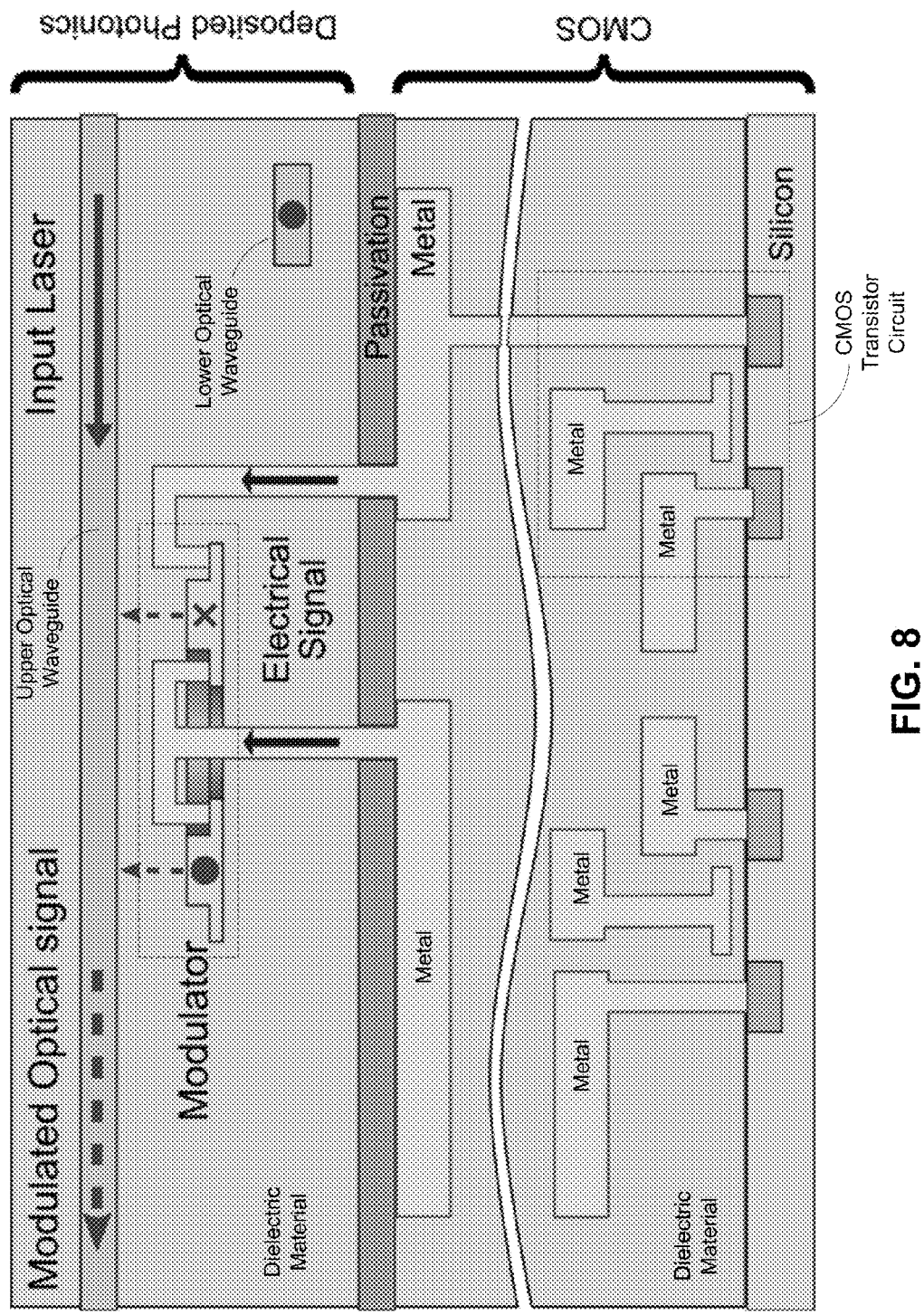
FIG. 8 shows an example of an optical modulator formed in a CMOS backend deposited photonic device based on the architecture in FIG. 6.

FIG. 8 shows an example of an optical modulator formed in a CMOS backend deposited photonic device based on the architecture in FIG. 6. An optical ring is formed below the upper optical waveguide to receive, via evanescent coupling, the input light guided by the upper optical waveguide. The optical ring resonator is configured as an optical modulator (e.g., the optical ring modulator in FIG. 4) which is electrically coupled to a CMOS transistor circuit in the Front End Of Line (FEOL) fabricated on the silicon substrate at the bottom for supplying an electrical modulation control signal that causes the modulation operation in the optical ring resonator. As such, the input light that is coupled into the optical ring resonator is optically modulated and the modulated light is then evanescently coupled back to the upper optical waveguide.

Figure 9:
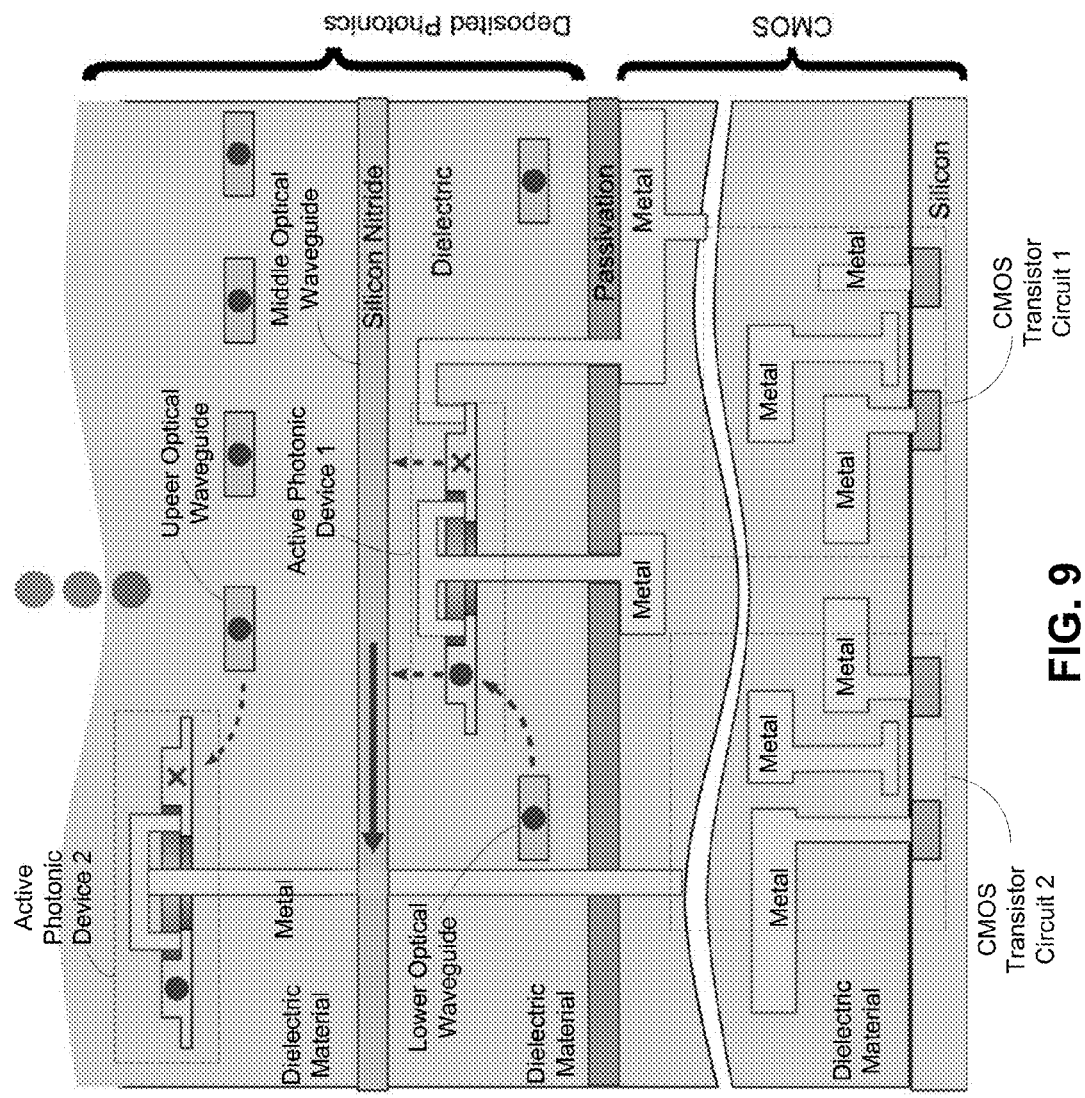
FIG. 9 shows an example of a CMOS backend deposited photonic device based on the architecture in FIG. 6 showing that two different active photonic devices 1 and 2 in two different multi-layered optical stacks are electrically coupled to two different CMOS transistor circuits 1 and 2, respectively, that are formed in the Front End Of Line (FEOL) fabricated on the silicon substrate at the bottom.

FIG. 9 shows an example of a CMOS backend deposited photonic device based on the architecture in FIG. 6 showing that two different active photonic devices 1 and 2 in two different multi-layered optical stacks are electrically coupled to two different CMOS transistor circuits 1 and 2, respectively, that are formed in the Front End Of Line (FEOL) fabricated on the silicon substrate at the bottom. Based on the multi-layered design in FIG. 1A, the number of optical layers over the CMOS layer can be selected based on the needs of a particular application. In addition, more than one CMOS layer may be provided in some applications.

Backend deposited silicon photonics offers multiple benefits-independence from complex CMOS frontend processing, reduced constraint in photonic footprint, and multi-level architecture. In some CMOS processes, a process flow may involve many layers, e.g., more than 40 mask layers. In such a complex set of processes, every small tweak to a given processing step can lead to unintended compounding of side effects that can adversely affect yield or even render a process unstable. It does not help that the industry profit margin is thin, so it is almost natural for the CMOS foundries to be very risk adverse and unreceptive to bringing new processes or modules into their facility, including photonics.

The FEOL of a CMOS is the most sensitive part of the process, and thus foundries are rightfully opposed to making changes at the frontend to accommodate photonics. BDSP (Backend Deposited Silicon Photonics) decouples photonics from the most sensitive part of a CMOS process, and adds the whole photonics module after the very end of a CMOS process, so that foundries are not required to change their process. In fact, backend photonic processing can in principle be done in a different foundry from which the CMOS wafer was fabricated, since the photonics process is its own complete module that does not intrude upon, or depend on other processing steps of the underlying CMOS. This aspect greatly lowers the barrier of introducing silicon photonics into manufacturing.

The cost of adding the photonics module is kept low by use of i-line or 248 nm lithography used in non-critical backend layers. The SiN waveguide has a width of 1 um, and polysilicon active waveguide is 700 nm wide, well within capability of i-line lithography. Furthermore, the lateral alignment requirement across layers is expected to be around 100 nm depending on specific extinction ratio requirements, which is easily met even by i-line tool at 12 nm overlay. Photonic module will add approximately 7 mask layers per active layer and 1 layer per passive SiN waveguide, where much of active layer masks can be reused for patterning additional devices in different layers in some scenarios to reduce cost. Note that the masks become exponentially more expensive as the technology node becomes smaller, and by using backend process lithography, which is a generation or two behind the node of the process, total cost of the photonic module can be kept to a small fraction of the total mask cost process cost.

Deposited silicon photonics also greatly alleviates the constraints on footprint of photonic devices. The frontend silicon real estate is considered a highly valuable commodity, since every savings in area translates to more dies, hence revenue, per wafer. This is the reason why the microelectronics industry has pursued larger wafers and smaller transistors. If integrating photonics in the frontend means that total die area is going to increase significantly, one takes a hit not only because there are less dies per wafer, but also because yield of a die decreases nonlinearly as a function of the die area.

Therefore, if photonics is to be introduced in the frontend, its footprint is an important factor and a compact photonic device design is desirable with the footprint as small as possible. An optical ring resonator is one of the well-known compact photonic structures (along with photonic crystal cavities and others). However, the ring resonator in many designs remains to be relatively large, e.g., several microns in radius. This ring resonator footprint translates to hundreds of micron squared of footprint once optical isolation is considered. In addition, photonic transceiver circuitries in various implementations tend to be several hundreds of micron squared per channel, which adds significantly to the total area. Therefore, moving the photonic devices out of the frontend significantly decreases the total real estate needed for photonic interconnects, enhancing its area competitiveness. This competitive edge becomes even more apparent when we consider other common designs like Mach-Zehnder interferometer based modulators which can easily approach a millimeter in length in order to achieve sufficient extinction ratio at CMOS voltages. Therefore, by separating the photonics to dedicated layers, we greatly alleviate the issue of photonic footprint.

Similar to the multiple metal layers in CMOS backend, deposited silicon photonics naturally lends itself to multilayer optical routing, and in addition, deposited silicon photonics further enables multiple layers of active devices. A network-on-a-chip (NOC) that supports communication between cores in a massively multicore chip multiprocessor, for example, requires a closely knit network that can only be realized with many waveguide crossings. In-plane waveguide crossing is inherently lossy, and even relatively low loss (e.g., 0.7 dB/cross) can accumulate quickly and renders a network topology infeasible. However, in BDSP with multiple layers of low loss waveguides with very low crossing losses as discussed earlier, such network is perfectly feasible. Another benefit of having photonics on the backend is its easy access to end fire coupling from the periphery of the die. In a logic die where top side of the chip is completely covered in arrays of bumps for I/O, accommodating fibers vertically among arrays of bumps may be difficult. However, side of the die remains clear, and the plasma etched facet to define the smooth facet required for end fire coupling can be used to achieve efficient side coupling while being compatible with both flipchip packaging and mass manufacturing in just a single dielectric etch process followed by dicing. In addition, on-wafer testability can be maintained by use of grating couplers in SiN layers for optical testing before bump metallization.

Backend deposited silicon photonics has a multitude of benefits including reduced constraint in photonic footprint, multi-level optical routing, potential for unique device and system architecture that makes use of its 3D nature, and most importantly its independence from CMOS. The combination of mass production compatible multi-level Silicon active layers, modularity, and strict CMOS compatibility makes BDSP an appealing solution for both photonics designers and CMOS foundries. This opens up a different dimension to silicon photonic integration, potentially transforming what photonic integration on CMOS means and help more rapid adoption by the CMOS foundries in part due to its fundamentally non-intrusive nature to the CMOS process The above multilayer platforms for integrating semiconductor integrated circuit dies, optical waveguides and photonic devices can be implemented to include various optical and photonic functionalities in the optical layers. Referring back to FIG. 1A, in some applications, certain photonic functions may be difficult to be integrated into the optical layers 120. Such photonic functions may be added to the multilayer platforms in FIG. 1A by bounding photonic chips on top of the optical layers 120.

Figure 10:
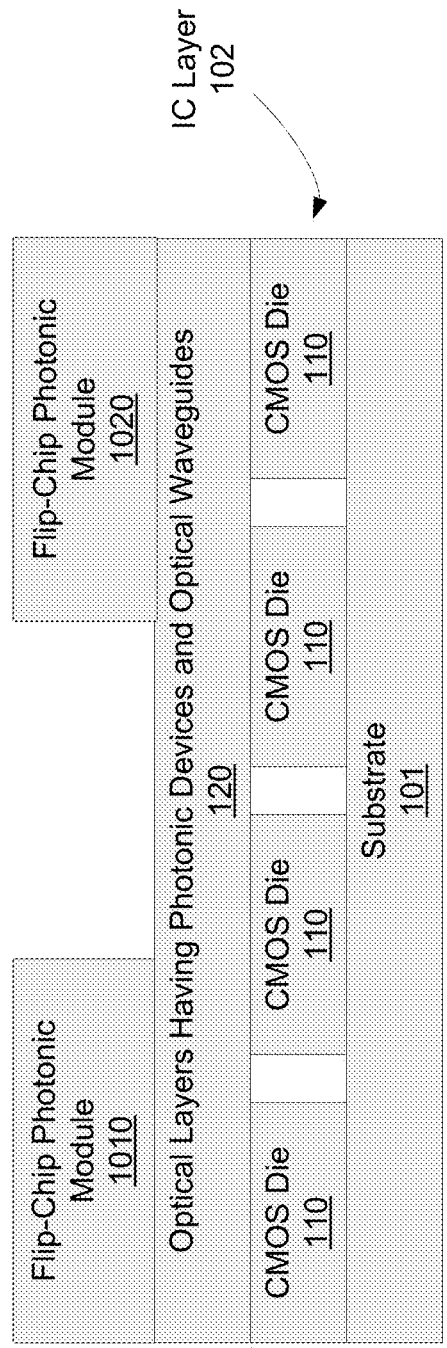
FIG. 10 shows an example of adding certain photonic chips on top of the optical layers in FIG. 1A by chip bounding.

FIG. 10 shows an example of adding certain photonic chips 1010 and 1020 on top of the optical layers 120 by chip bounding. For example, a photonic chip 1010 can be a laser such as a semiconductor quantum well laser that is bounded to provide laser light to the optical layers 120. Various chip bounding techniques can be used to provide the desired mechanical connections, desired electrical connectivity and optical coupling.

The above inclusion of photonic functions based on the optical layers 120 in the multilayer platforms in FIG. 1A and other implementations can be implemented by including one or more nonlinear optical devices. Such a nonlinear optical device can be fabricated in a compatible manner with the MCM. For example, Aluminum Nitride (AlN) and low optical loss materials such as Hydex by Little Optics and others can be used to form a nonlinear optical device in the MCM platforms disclosed in this document.

Low-loss optical materials, structures and methods disclosed in U.S. Pat. No. 6,614,977 entitled "Use of deuterated gases for the vapor deposition of thin films for low-loss optical devices and waveguides" can be used to implement the structures and devices disclosed in this document. The disclosure of U.S. Pat. No. 6,614,977 is incorporated by reference as part of this document. Among others, the '977 Patent discloses devices and methods for the vapor deposition of amorphous, silicon-containing thin films using vapors comprised of deuterated species. Thin films grown on a substrate wafer by this method contain deuterium but little to no hydrogen. Optical devices comprised of optical waveguides formed using this method have significantly reduced optical absorption or loss in the near-infrared optical spectrum commonly used for optical communications, compared to the loss in waveguides formed in thin films grown using conventional vapor deposition techniques with hydrogen containing precursors. In one variation, the optical devices are formed on a silicon-oxide layer that is formed on a substrate, such as a silicon substrate. The optical devices of some variations are of the chemical species SiOxNy:D. Since the method of formation requires no annealing, the thin films can be grown on electronic and optical devices or portions thereof without damaging those devices. In one embodiment, deuterated gases (gases and vapors are used interchangeably herein), such as $SiD_4$ and $ND_3$ (D being deuterium), serving as precursors, along with a gaseous source of oxygen, such as nitrous-oxide ($N_2O$) or oxygen ($O_2$), are used for the chemical vapor deposition of silicon-oxynitride ($SiO_xN_y$:D) or other non-polymeric thin films on a cladding. The cladding is composed, for example, of silicon oxide ($SiO_2$), phosphosilicate glass, fluorinated silicon oxide, or $SiO_xN_y$:D having an index of refraction less than that of the thin film. In implementations, the cladding is formed on a substrate, such as silicon, quartz, glass, or other material containing germanium, fused silica, quartz, glass, sapphire, SiC, GaAs, InP, or silicon. In embodiments of the present invention, the thin film and the cladding formed on the substrate can vary in thickness and width, depending, for example, on the device being formed. In embodiments of the present invention, the cladding is formed with a thickness varying from 2 to 20 microns, and the thin film is formed with a thickness varying from about 0.5 to 5 microns. Other thicknesses of the cladding and the thin film are also usable in accordance with the present invention. For example, ridge structures can be formed from the thin deuterium containing films such as $SiO_xN_y$, $Si_3N_4$, or $SiO_2$, by an etching process, such as reactive ion etching (RIE), to form an optical waveguide, one basic building block of integrated optical device.

Figure 11:
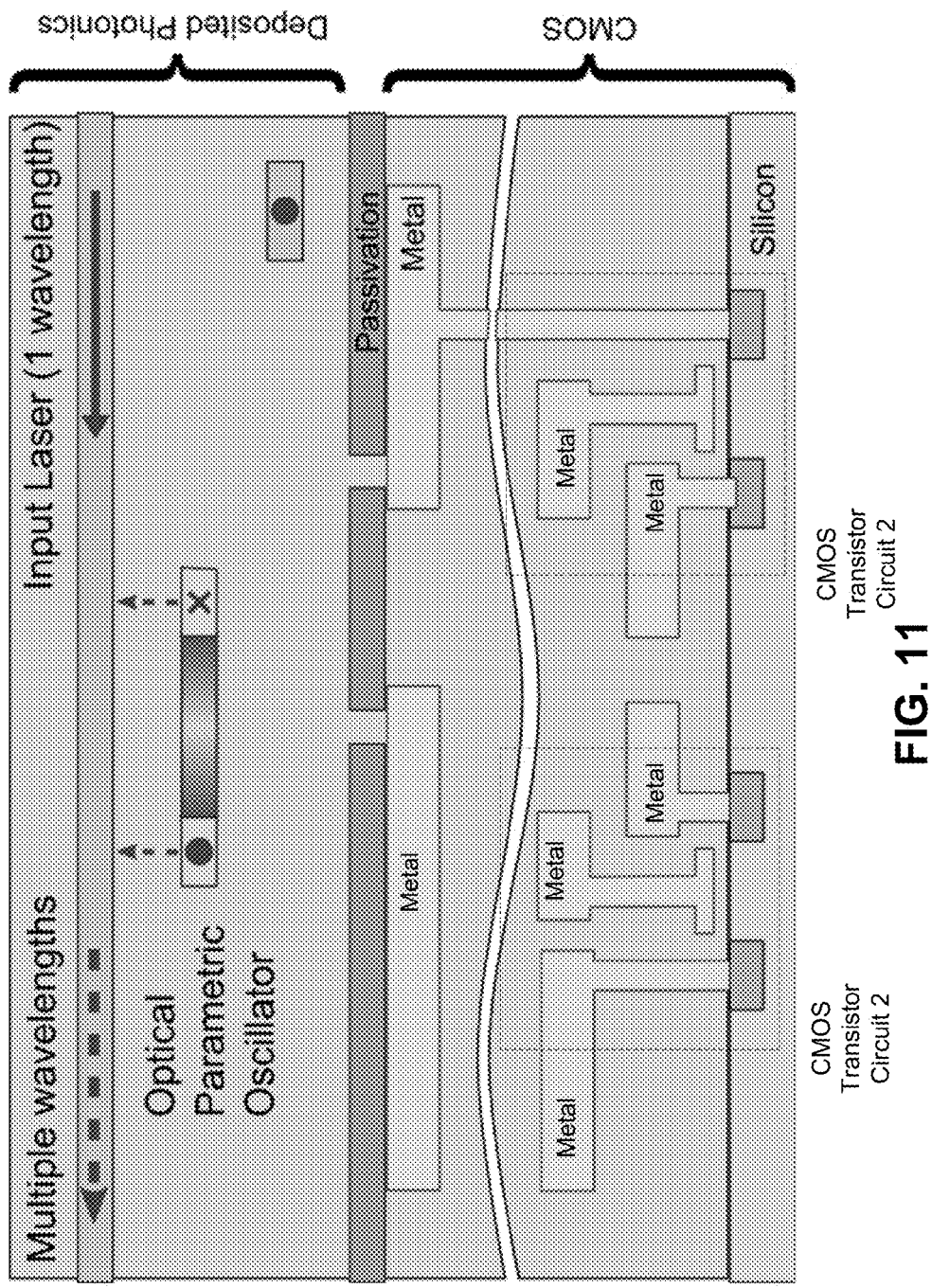
FIG. 11 shows an example of a photonic device having a nonlinear optical device and a CMOS backend in a multilayer platform.

FIG. 11 shows an example of a photonic device having a nonlinear optical device and a CMOS backend in a MCM platform. In this example, the non-linear optical device is located below one or more optical waveguides and is optically coupled to at least one optical waveguide. For example, an input laser signal in the optically coupled optical waveguide is coupled into the non-linear optical device to optically coupled the non-linear optical device to cause a non-linear optical effect to occur, e.g., a nonlinear harmonic generation, four wave mixing or optical parametric oscillation. The light in the non-linear optical device is coupled out of the non-linear optical device into one optical waveguide above to produce an optical output from the non-linear optical device.

A particular kind of nonlinear optical devices is an Optical Parametric Oscillator (OPO) which can be used to generate multiple new wavelengths from a single laser source. This OPO operation in a MCM platform is attractive for implementing a wavelength division multiplexing (WDM) system. The OPO operation can be generated by using materials like AlN and Hydex. Specifically, the example in FIG. 11 can be used in a network-on-a-chip system by optical wavelength-division-multiplexing (WDM) to increase the total available bandwidth of such a system. WDM typically requires separate laser sources for each of the desired WDM wavelengths, increasing the total cost of the system and making integration and assembly difficult. To overcome this issue, a nonlinear optical device, such as an Optical Parametric Oscillator (OPO), can be used to generate multiple wavelengths of laser from a single laser source, which mitigates the aforementioned issues. An OPO can be fabricated in high temperature annealed Silicon Nitride (SiN), but the high temperature annealing step used in fabricating OPO in SiN makes SiN incompatible with integration on a MCM because the annealing step will destroy the electronics underneath. Advantageously, OPO devices can be fabricated by using optical materials that do not require high temperature annealing process incompatible with MCM. Examples of such compatible materials include sputtered Aluminum Nitride (AlN) or Hydex™, and OPO has been fabricated and successfully demonstrated in the respective materials.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An integrated semiconductor device having integrated circuits respectively formed on different semiconductor integrated circuit dies, comprising:
   a carrier substrate structured to form openings on a top side of the carrier substrate;
   semiconductor integrated circuit dies fixed to bottom surfaces of the openings of the carrier substrate, each semiconductor integrated circuit die including a semiconductor substrate and at least one integrated circuit formed on the semiconductor substrate to include one or more circuit components, and each semiconductor integrated circuit die being structured to have a top surface substantially coplanar with the top side of the carrier substrate; and
   planar layers formed on top of the top surfaces of the semiconductor integrated circuit dies and the top side of the carrier substrate to include optical waveguides and photonic devices to provide (1) intra-die optical connectivity for photonic devices associated with a semiconductor integrated circuit die, or (2) inter-die optical connectivity for photonic devices associated with different semiconductor integrated circuit dies.

2. The device as in claim 1, wherein:
the optical waveguides in the planar layers are configured to provide direct optical routing amongst photonic devices associated with different semiconductor integrated circuit dies in different openings on the carrier substrate without converting an optical signal to be routed into an electrical signal.

3. The device as in claim 1, wherein:
each semiconductor integrated circuit die includes conductive wires or solder bumps for electrical connection of a respective integrated circuit formed on a respective semiconductor substrate without having optical interconnects.

4. The device as in claim 1, wherein:
each semiconductor integrated circuit die includes a top dielectric layer formed over a respective integrated circuit formed on top of a respective semiconductor substrate, and the top dielectric layer has a top surface that is substantially coplanar with the top side of the carrier substrate.

5. The device as in claim 1, wherein:
the planar layers include
   a lower dielectric layer over the top surfaces of the semiconductor integrated circuit dies and the top side of the carrier substrate;
   an optical waveguide formed on top of the lower dielectric layer; and
   a top dielectric layer formed on top of the optical waveguide and the lower dielectric layer to enclose the optical waveguide between the lower and top dielectric layers.

6. The device as in claim 1, wherein:
the optical waveguides in the planar layers include an optical waveguide having an optical ring.

7. The device as in claim 1, comprising:
a central processing unit (CPU) on one of the semiconductor integrated circuit dies to enable communication to and from the CPU via one or more of the optical waveguides.

8. The device as in claim 7, further comprising:
a memory device in communication with the CPU.

9. The device as in claim 8, wherein:
the optical waveguides are connected to provide high-bandwidth communications between the CPU and the memory device.

10. The device as in claim 7, further comprising:
a graphic processing unit (GPU) in communication with the CPU.

11. The device as in claim 10, wherein:
the optical waveguides are connected to provide high-bandwidth communications between the CPU and the GPU.

12. The device as in claim 7, wherein:
the optical waveguides are connected to provide high-bandwidth communications between the CPU and another device on the carrier substrate.

13. The device as in claim 1, wherein:
the planar layers include multiple optical layers.

14. The device as in claim 13, wherein:
the multiple optical layers in the planar layers include an active optical layer that includes at least one optically active device which can be controlled by control signal to change or modify a property of an optical signal.

15. The device as in claim 1, wherein:
the semiconductor integrated circuit dies include complementary metal-oxide-semiconductor (CMOS) circuits.

16. The device as in claim 1, wherein:
each semiconductor integrated circuit die includes conductive vias to provide an electrical contact for the integrated circuit with an active optical layer that includes at least one optically active device which can be controlled by control signal to change or modify a property of an optical signal.

17. The device as in claim 1, wherein:
each semiconductor integrated circuit dies is fixed to a bottom surface of a respective opening of the carrier substrate via oxide bonding between a respective semiconductor substrate and the bottom surface of the respective opening of the carrier substrate.

18. The device as in claim 1, wherein:
each semiconductor integrated circuit dies is fixed to a bottom surface of a respective opening of the carrier substrate via oxide bonding by a flowable oxide layer formed between a respective semiconductor substrate and the bottom surface of the respective opening of the carrier substrate.

19. A method for providing optical interconnects to various devices on an integrated platform, comprising:
providing different integrated circuits on separated semiconductor integrated circuit dies;
embedding the semiconductor integrated circuit dies in openings of a carrier substrate to fix each semiconductor die on a bottom surface of the carrier substrate in each opening to make a top surface of each semiconductor integrated circuit die substantially coplanar with a top side of the carrier substrate;
forming planar layers on top of the top surfaces of the semiconductor integrated circuit dies and the top side of the carrier substrate to include optical waveguides and photonic devices to provide inter-die optical connectivity for photonic devices associated with different semiconductor integrated circuit dies to enable direct optical communication from one die to another die without converting an optical signal into an electrical signal when communicating between two dies.

20. The method as in claim 19, comprising:
including in the planar layers multiple optical layers to provide optical interconnects in each of the multiple optical layers.

21. The method as in claim 19, wherein:
the multiple optical layers in the planar layers include an active optical layer.

22. The method as in claim 19, wherein:
forming optical rings in the planar layers to be optically coupled to the optical waveguides.

23. A method for fabricating an integrated platform that supports different devices and optical interconnects for the different devices, comprising:
processing a carrier substrate to form openings on a top side of the carrier substrate;
forming an adhesive layer in a bottom surface in each opening of the carrier substrate;
placing semiconductor integrated circuit dies over bottom surfaces of the openings of the carrier substrate so that each semiconductor integrated circuit die is fixed in position by the adhesive layer, wherein each semiconductor integrated circuit die includes a semiconductor substrate and an integrated circuit formed on the semiconductor substrate to include one or more circuit components, and each semiconductor integrated circuit die is structured to have a top surface substantially coplanar with the top side of the carrier substrate;
forming a sacrificial layer over the top surfaces of the semiconductor integrated circuit dies and the top side of the carrier substrate;
processing the sacrificial layer to produce a flat top surface;
forming planar layers over the flat top surface of the sacrificial layer to include optical waveguides and photonic devices in the planar layers to provide inter-die optical connectivity for photonic devices associated with different semiconductor integrated circuit dies; and
forming electrical contacts to the semiconductor integrated circuit dies.

24. The method as in claim 23, wherein:
the semiconductor integrated circuit dies and the carrier substrate are Si dies and substrate, and the sacrificial layer includes a silicon oxynitride.

25. The method as in claim 23, wherein:
the planar layers includes two or more optical waveguide layers where each optical waveguide layer is patterned to include one or more optical waveguides.

26. An integrated semiconductor device having integrated circuits respectively formed on different semiconductor integrated circuit dies, comprising:
a carrier substrate structured to form openings on a top side of the carrier substrate;
semiconductor integrated circuit dies fixed to bottom surfaces of the openings of the carrier substrate, each semiconductor integrated circuit die including a semiconductor substrate, at least one integrated circuit formed on the semiconductor substrate, and one or more conductive contacts to provide electrical conductivity between the at least one integrated circuit and a circuit outside the semiconductor integrated circuit die;
a dielectric layer formed over the semiconductor integrated circuit dies and the top side of the carrier substrate and processed to provide a planar top surface; and
planar optical layers formed on top of the planar top surface of the dielectric layer, the planar optical layers structured to include one or more optical waveguides and one or more photonic devices,
wherein one photonic device in the planar optical layers is electrically coupled to one of the semiconductor integrated circuit dies underneath the planar optical layers to either receive an electrical signal from, or send an electrical signal to, the coupled semiconductor integrated circuit die, and
wherein one optical waveguide in the planar optical layers is coupled to optically interconnect the one photonic device electrically coupled to the semiconductor integrated circuit die with another photonic device in the planar optical layers.

27. The device as in claim 26, wherein:
the one photonic device electrically coupled to the semiconductor integrated circuit die is an optical detector that converts received light into an electrical signal.

28. The device as in claim 26, wherein:
the one photonic device electrically coupled to the semiconductor integrated circuit die is an optical modulator that modulates received light in response to an electrical signal from the semiconductor integrated circuit die.

29. The device as in claim 26, wherein:
the one photonic device electrically coupled to the semiconductor integrated circuit die is operable to produce light in response to an electrical signal from the semiconductor integrated circuit die.

30. The device as in claim 26, wherein:
the one photonic device electrically coupled to the semiconductor integrated circuit die is an tunable optical resonator that changes a resonator property in response to an electrical signal from the semiconductor integrated circuit die.

31. The device as in claim 26, further comprising:
additional planar optical layers formed on top of the planar optical layers, the additional planar optical layers structured to include at least one additional photonic device that is electrically coupled to another one of the semiconductor integrated circuit dies underneath the planar optical layers to either receive an electrical signal from, or send an electrical signal to, the another one of the semiconductor integrated circuit dies; and
a conductive via that passes through planar optical layers and extends between the another one of the semiconductor integrated circuit dies and the additional photonic device in the additional planar optical layers.

32. The device as in claim 26, further comprising:
a first optical waveguide in the planar optical layers that is located above a first photonic device and is optically coupled to the first photonic device; and
a second optical waveguide in the planar optical layers that is located below the first photonic device and is optically coupled to the first photonic device so that light is coupled between the first and the second optical waveguides via coupling with the first photonic device.

33. The device as in claim 32, wherein:
the first photonic device includes an optical resonator.

34. The device as in claim 33, wherein:
the first photonic device includes a semiconductor diode structure across the optical resonator to provide an electrical control over the optical resonator.

35. The device as in claim 26, further comprising:
a photonic chip located above the planar optical layers and engaged to the planar optical layers to provide optical or electrical connectivity with the planar optical layers.

36. The device as in claim 35, wherein:
the photonic chip includes a laser that generate laser light that is optically coupled to the planar optical layers.

37. The device as in claim 26, wherein:
the planar optical layers include an optical parametric oscillator.

38. The device as in claim 26, wherein:
the planar optical layers include a non-linear optical device that exhibits a nonlinear optical effect.

39. An integrated semiconductor device having integrated circuits respectively formed on different semiconductor integrated circuit dies, comprising:
a carrier substrate structured to form openings on a top side of the carrier substrate;
semiconductor integrated circuit dies fixed to bottom surfaces of the openings of the carrier substrate, each semiconductor integrated circuit die including a semiconductor substrate, at least one integrated circuit formed on the semiconductor substrate, and one or more conductive contacts to provide electrical conductivity between the at least one integrated circuit and a circuit outside the semiconductor integrated circuit die;
a dielectric layer formed over the semiconductor integrated circuit dies and the top side of the carrier substrate and processed to provide a planar top surface; and
planar optical layers formed on top of the planar top surface of the dielectric layer, the planar optical layers structured to include one or more optical waveguides and one or more photonic devices,
wherein one of the one or more photonic devices in the planar optical layers is electrically coupled to one of the semiconductor integrated circuit dies underneath the planar optical layers to either receive an electrical signal from, or send an electrical signal to, the coupled semiconductor integrated circuit die, and
wherein one of the one or more photonic devices in the planar optical layers includes a nonlinear optical device that is optically coupled one optical waveguide to receive a pump light and to produce one or more optical signals at optical wavelengths different from the pump light.

40. The device as in claim 39, wherein the nonlinear optical device includes an optical parametric oscillator.

41. The device as in claim 39, wherein the nonlinear optical device is configured to cause four wave mixing.

42. The device as in claim 39, wherein the nonlinear optical device is configured to cause nonlinear harmonic generation.

* * * * *

UNITED STATES PATENT AND TRADEMARK OFFICE
CERTIFICATE OF CORRECTION

PATENT NO. : 9,620,489 B2
APPLICATION NO. : 14/298875
DATED : April 11, 2017
INVENTOR(S) : Michal Lipson and Yoon Ho Lee It is certified that error appears in the above-identified patent and that said Letters Patent is hereby corrected as shown below:

In the Drawings

In Fig. 9, Sheet 11 of 13, delete "Upeer" and insert -- Upper --.

In the Specification

In Column 3, Line 67, delete "coupled one" and insert -- coupled to one --.

In Column 8, Line 4, delete "and or" and insert -- and/or --.

In Column 8, Line 10, delete "contracts" and insert -- contacts --.

In Column 8, Line 12, delete "contracts" and insert -- contacts --.

In Column 10, Line 45, delete "(SiN (waveguides" and insert -- (SiN) waveguides --.

In Column 10, Line 47, delete "a Excimer" and insert -- an Excimer --.

In Column 13, Line 10, delete "flipchip" and insert -- flip chip --.

In Column 13, Line 28, delete "process" and insert -- process. --.

In Column 14, Line 45, delete "coupled" and insert -- couple --.

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*

In the Claims

In Column 19, Line 3, in Claim 30, delete "an tunable" and insert -- a tunable --.

In Column 20, Line 34, in Claim 39, delete "coupled one" and insert -- coupled to one --.